United States Patent [19]

Milberger et al.

[11] Patent Number: 5,070,538
[45] Date of Patent: Dec. 3, 1991

[54] WIDE BAND DOMINO EFFECT HIGH VOLTAGE REGULATOR

[75] Inventors: Walter E. Milberger, Panama City, Fla.; Charles S. Kerfoot, Pasadena; Franklin B. Jones, Catonsville, both of Md.

[73] Assignee: The United States of America as represented by the Secretary of the Air Force, Washington, D.C.

[21] Appl. No.: 459,870

[22] Filed: Jan. 2, 1990

[51] Int. Cl.[5] .................. H04B 1/04; G05F 1/40; H03F 3/04
[52] U.S. Cl. ................... 455/126; 323/265; 323/270; 330/297
[58] Field of Search .............. 455/126; 323/265, 270, 323/350, 351; 330/297

[56] References Cited

U.S. PATENT DOCUMENTS

| | | | |
|---|---|---|---|
| 3,289,057 | 11/1966 | Melanson | 317/249 |
| 3,361,945 | 1/1968 | Mittler et al. | 317/249 |
| 3,500,172 | 3/1970 | Eckstein, Jr. | 323/270 |
| 3,551,788 | 12/1970 | Summer | 323/270 |
| 4,400,660 | 8/1983 | Schaefer | 323/270 |
| 4,667,144 | 5/1987 | Jones et al. | 323/271 |
| 4,757,251 | 7/1988 | Fuchs | 323/268 |
| 4,893,070 | 1/1990 | Milberger et al. | 323/270 |
| 4,897,617 | 1/1990 | Milberger et al. | 330/297 |

Primary Examiner—Curtis Kuntz
Assistant Examiner—Andrew Faile
Attorney, Agent, or Firm—Bernard E. Franz; Donald J. Singer

[57] ABSTRACT

The high voltage regulator employs a field effect transistor (FET) amplifier and a wide band frequency compensated RC voltage divider. The device comprises a FET amplifier used as a current source in a 20 KV power supply. The negative output of the supply is sensed by a voltage divider consisting of two resistors in parallel with two capacitors. The voltage divider output is applied to the non-inverting input of an operational amplifier whose reference is set to affect the linear operation of an inverting operational amplifier. A no load to full load and line regulation of 0.1% is provided to a microwave tube. For a 16-KV regulated output the inverting amplifier must have a dc operation point of 4 KV to accommodate a 20% storage capacitor voltage droop and a ±5% line change. At this level the inverting amplifier provides a swing of ±4 KV. This range allows for a large line voltage variation and storage capacitor voltage droop. The dynamic range and bandwidth of the regulator not only provides regulation for long term line voltage regulation but also negates the effects of line voltage transitions over a wide frequency and amplitude range.

10 Claims, 11 Drawing Sheets

OPEN LOOP GAIN-PHASE CHARACTERISTICS (Cs = 0.002 µf)

Fig. 3

MPT1N100 TRANSISTOR TRANSCONDUCTANCE

*Fig. 4*

OPEN LOOP GAIN-PHASE CHARACTERISTICS (Cs = 0.1 µf)

Fig. 5

TWO STAGE MILBERGER DOMINO EFFECT AMPLIFIER CHARACTERISTIC

Hz ⟶ FREQUENCY

TWO STAGE DOMINO EFFECT AMPLIFIER CHARACTERISTIC

Fig. 9

RESPONSE OF VOLTAGE DIVIDER FOR ONE AND TWO STAGE OP.

Fig. 10

HIGH VOLTAGE DIVIDER CUT-AWAY VIEW

WIDE BAND DOMINO EFFECT HIGH VOLTAGE REGULATOR

RIGHTS OF THE GOVERNMENT

The invention described herein may be manufactured and used by or for the Government of the United States for all governmental purposes without the payment of any royalty.

RELATED PATENT APPLICATIONS

There are two related copending patent applications by the same applicants, "Domino Effect Amplifier" Ser. No. 7/318,211 now U.S. Pat. No. 4,897,617, issued Jan. 9, 1990, and "Domino Effect Shunt Voltage Regulator" Ser. No. 7/318,210 now U.S. Pat. No. 4,893,070, issued Jan. 30, 1990, both filed Feb. 28, 1989, which are hereby incorporated by reference.

BACKGROUND OF THE INVENTION

The present invention relates generally to a wide band high voltage regulator.

Until the invention of the Milberger Domino Effect Amplifier, all high voltage (2-100 kv) linear regulators used vacuum tubes as pass elements. Because of the auxiliary supplies needed to support the operation of vacuum tubes (filament and grid bias supplies), their use was most suitable for ground deck regulators. The most common regulator configuration used in transmitter supplies is one in which the vacuum tube is used in the ground return leg of the raw high voltage power supply. When a vacuum tube is used in this regulator configuration, the use of the novel compensated R-C high voltage divider disclosed herein will greatly improve the performance.

United States patents of interest include U.S. Pat. No. 3,289,057, to Melanson which teaches an adjustable capacitor with a moving dielectric. U.S. Pat. No. 3,361,945 to Mittler et al shows a piston capacitor having a cylindrical electrode, a piston electrode and a dielectric therebetween. U.S. Pat. No. 4,757,251 to Fuchs shows a circuit for a high voltage regulator wherein several output amplifiers are connected in series. U.S. Pat. No. 4,667,144 to Jones teaches a MOSFET isolation amplifier in a regulator for permitting precise regulation through a reactive load.

SUMMARY OF THE INVENTION

An objective of the invention is to provide a high voltage transistor linear regulator of superior characteristics.

The invention relates to a high voltage regulator employing a field effect transistor (FET) amplifier and a wide band frequency compensated RC voltage divider. The device comprises a FET amplifier used as a current source in a 20 KV power supply. The negative output of the supply is sensed by a voltage divider consisting of two resistors in parallel with two capacitors. The voltage divider output is applied to the non-inverting input of an operational amplifier whose reference is set to affect the linear operation of an inverting operational amplifier. A no load to full load and line regulation of 0.1% is provided to a microwave tube. For a 16-KV regulated output the inverting amplifier must have a dc operation point of 4 KV to accommodate a 20% storage capacitor voltage droop and a ±5% line change. At this level the inverting amplifier provides a swing of ±4 KV. This range allows for a large line voltage variation and storage capacitor voltage droop. The dynamic range and bandwidth of the regulator not only provides regulation for long term line voltage regulation but also negates the effects of line voltage transitions over a wide frequency and amplitude range.

Those features which are considered novel or advance the state of the art technology of high voltage regulated power supplies are:

(1) A high voltage regulated power supply consisting of a wide band voltage divider and an N-channel or P-channel Milberger Domino Effect Amplifier.

(2) A shielded wide band high voltage divider consisting of two resistors that are frequency compensated by parallel capacitors; wherein, a variable high voltage quartz glass piston capacitor is used to set the RC product of the high level arm equal to that of the low level arm.

(3) A pulse energy storage capacitor voltage droop compensator capable of reducing the size of the capacitor by 100 times for a given voltage droop characteristic.

(4) An active filter capable of attenuating 2400 Hz power supply ripple content by 46 db.

(5) A fast response high voltage transmitter regulated power supply that is virtually impervious to system mode changes, thus negating the need of feed forward loops.

(6) A fast acting shunt regulator to protect Milberger Domino Effect power chain amplifiers when transmitter tube arcs occur.

(7) A high speed regulator (20,000 v/μs slew rate) to provide self protection during transmitter tube arc or supply short circuit conditions.

(8) An amplitude compensation regulator loop which samples the transmitter r-f output to improve AM sidebands by closing the loop through the body regulator power chain amplifier (the body regulator power chain amplifier is the DC power conditioning system; e.g. the Domino Effect Amplifier plus feedback).

(9) A phase compensation regulator loop which samples the transmitter r-f output to improve FM sidebands by closing the loop through the body regulator power chain amplifier.

(10) A means of modulating and shaping the transmitter r-f output by injecting a control signal into the body regulator reference voltage.

DETAILED DESCRIPTION

Introduction

This disclosure introduces a high voltage transistor linear regulator of superior characteristics. At a regulated voltage of −16 kilovolts and a current of 40 milliamperes, the open loop cross-over frequency is one MHz as referenced to a 500-hertz, 55-dB corner. The wide bandwidth is made possible by using the Milberger Domino Effect linear amplifier in the power chain and a novel compensated R-C voltage divider in the regulator's feedback chain. The excellent performance characteristics can virtually eliminate L-C passive filters in both three-phase 60 and 400 hertz power supplies. This is extremely important in radar transmitters where mode and duty changes are required. Thus, the requirements of feed forward loops which anticipate system duty changes are eased. The high quality regulator also enhances radar transmitter spectral purity by reducing supply ripple amplitude which cause AM and FM side bands. In pulsed radar applications where very little voltage droop can be permitted on the transmitter tube body supply, the size of the pulse energy storage capacitor can be reduced one or more orders of magnitude by using the Domino Effect regulator. The wide gain bandwidth product of the regulator makes this possible by compensating for the capacitor voltage droop. Size reduction of the storage capacitor greatly increases the longevity of the transmitter tubes by lowering the energy which the transmitter tube must absorb when inner electrode arcs occur.

Previous Method

Until the invention of the Milberger Domino Effect Amplifier, all high voltage (2-100 kv) linear regulators used vacuum tubes as pass elements. Because of the auxiliary supplies needed to support the operation of vacuum tubes (filament and grid bias supplies), their use was most suitable for ground deck regulators. The most common regulator configuration used in transmitter supplies is one in which the vacuum tube is used in the ground return leg of the raw high voltage power supply. When a vacuum tube is used in this regulator configuration, the use of the novel compensated R-C high voltage divider disclosed herein will greatly improve the performance.

New Method

The Milberger Domino Effect Amplifier has characteristics similar to a pentode vacuum tube, but its performance is even better than the tube when used in the same regulator circuit configuration. Furthermore, the Milberger Domino Effect Amplifier can be provided in either an N or P-channel package to accommodate either positive or negative supply voltages; a capability that the vacuum tube does not have. The Milberger Domino Effect Amplifier has been operated as a linear amplifier at voltages up to 20 kilovolts. No auxiliary supplies are required for its operation and its gain-bandwidth product and transconductance is much greater than that of most power class vacuum tubes. The projected mean time between failure (MTBF) of the Milberger Domino Effect Amplifier is better than that of the vacuum tube, since it operates as a single power MOSFET. Development of a Milberger Domino Effect Amplifier as a four-terminal Power Hybrid Package with a rating of 10 kilovolts at 200 watts has been initiated. Following the development of the PHP amplifier it will only be necessary to cascode 10-kilovolt packages to increase the voltage capability to what ever level is desired.

Regulator Circuit Configuration

Operation

Figure 1:
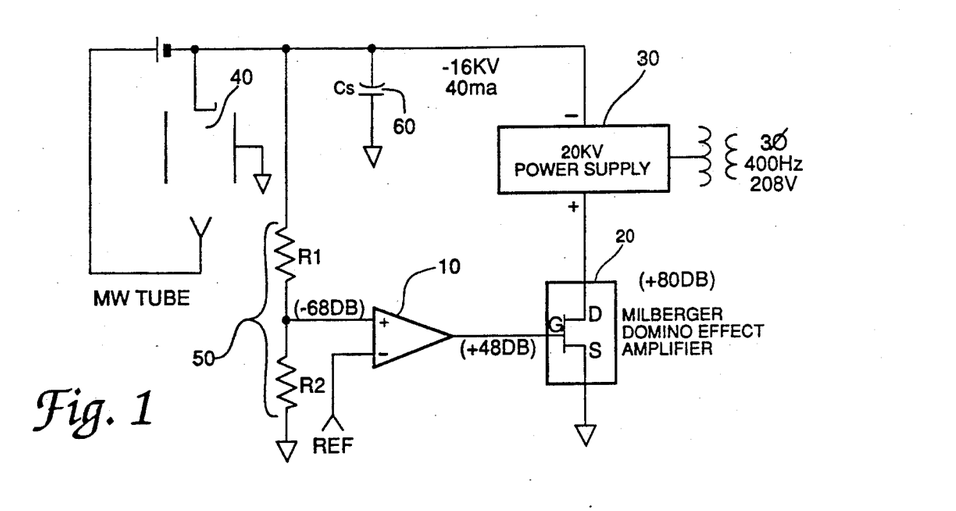
FIG. 1 is a block diagram of the Domino Effect Regulated Power Supply.

FIG. 1 is a block diagram of the Domino Effect Regulated Power Supply. In this configuration, a Domino Effect Amplifier 20 is used as a current source in the ground return of a 20-kilovolt raw power supply 30 power chain. The negative output of the supply 30 is sensed via a voltage divider 50 consisting of resistors R1 and R2. The voltage divider output is applied to the non-inverting input of an amplifier 10 whose reference is set to affect linear operation of the inverting amplifier 20.

A no load to full load and line regulation of 0.1 percent is provided for the body of the minus 16-kilovolt microwave tube 40. For a 16-kilovolt regulated output, amplifier 20 must have a dc operation point of 4 kilovolts to accommodate a 20% capacitor 60 voltage droop and ±5% line change. At this level, the Milberger Domino effect Amplifier can provide a voltage swing of plus to minus 4,000 volts. This range allows for a large line voltage variation and storage capacitor 60 voltage droop. The dynamic range and bandwidth of the regulator not only provides regulation for long term line voltage variations, but also negates the effects of line voltage transients over a wide frequency and amplitude range to meet the requirements of Mil Spec 704.

Regulator Requirements

Figure 2:
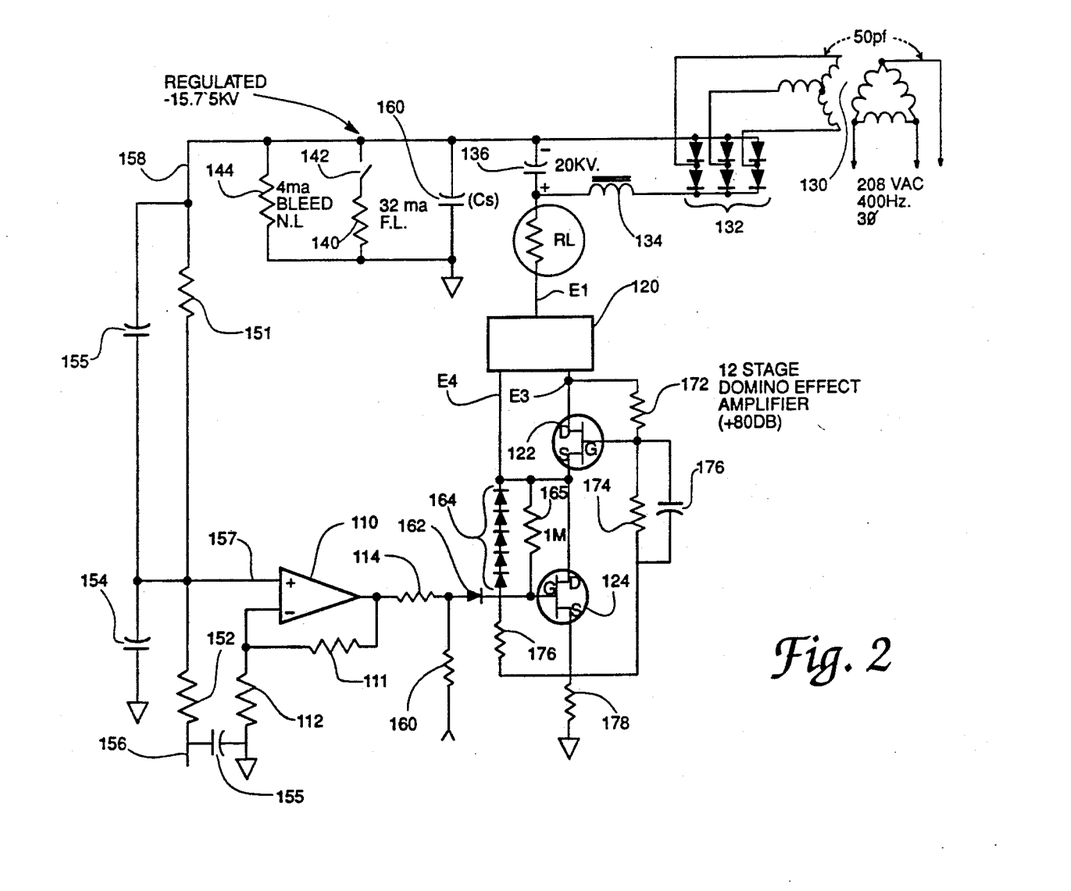
FIG. 2 is a schematic diagram of the Domino Effect Regulator.

The supply shown in FIG. 2 was designed to provide a pulsed load of 32 milliamperes at a regulated voltage of −15.75 kv with a pulse energy storage capacitor of 0.1 μf for a pulse width of ten milliseconds. For the 10 ms pulse width, the voltage droop across the Cs capacitor 160 would be 3200 volts at a current of 32 ma. To compensate for this voltage droop, a constant current source of 32 ma must be placed in series with the capacitor. Since the voltage droop is 20% of the regulated output, an open loop gain of 46 db over a band width of 1 Khz would be required to correct the droop to 0.1 percent. This gain width also provides rejection of at least 40 db for 2400 Hz and lower order ripple content of 400 Hz three phase supplies. For the conditions stated, a capacitor 100 times larger would be required to provide the same voltage droop in an uncompensated power supply. To allow for line variations of ±5%, an additional 800 volts must be added to the 3200 volts required for droop compensation. An additional 500 volts should be added to account for amplifier bottoming. Thus, the quiescent operating point of the current source Milberger Domino Effect Amplifier must be set at 4500 volts to meet the dynamic range required. This allows for a ±4 Kv voltage swing. Before the invention of the Milberger Domino Effect Amplifier, such performance was not possible with linear transistor amplifiers. As shown in FIG. 2, twelve 1,000 volt stages are used in the domino effect amplifier to permit a 30% voltage derating.

Actual Regulator Characteristics

The schematic diagram shown in FIG. 2 is the composite circuit used in the Wide Band Domino Effect H.V. Regulator. For the domino effect amplifier, a box 120 represents the 10-stage unit of FIG. 12, and two additional stages use transistors 122 and 124. A one-megohm resistor 172 is connected from the drain to gate of transistor 122, and a one-megohm resistor 174 shunted by a 10-picofarad capacitor 176 is connected from the gate of transistor 122 to the source of transistor 124. A 5-kilohm resistor 166 is connected from the gate to source of transistor 124, and a 10-ohm resistor 178 is connected from its source to ground.

In place of the transmitter tube 40 of FIG. 1, FIG. 2 uses a full-load resistor 140 in series with a switch 142, and a no-load bleed resistor 144. For the voltage divider 50, FIG. 2 has a 250-megohm resistor 151 shunted by a 0–0.25 picofarad piston capacitor 153 in series with a 100-kilohm resistor 152, to provide a 2500:1 divider (−68 dB). A 0.047 microfarad capacitor 154 is connected from the divider junction at lead 157 to ground. The lower end of resistor 152 is coupled to ground via a capacitor 155, across which a +6.3 volts DC reference voltage is applied at lead 156. The operational amplifier 110 has its plus input connected via lead 157 to the junction of resistors 151 and 152, its minus input connected via a 1000-ohm resistor 112 to ground, and a 200-ohm resistor connected from the output to the minus input. The output of the op amp 110 is coupled via a 100-ohm resistor 114 in series with a type 1N4148 blocking diode 162 to the gate of the first-stage transistor 124. Five type 1N4148 diodes 164 across a one-megohm resistor 165 are connected from the gate of transistor 124 to the source of transistor 122. The 20-kilovolt power supply comprises a delta-star three-phase transformer 130 which has 50 picofarads of capacitance between the primary and secondary, with the primary coupled to a 208-volt AC, 400 Hz, 3 phase source. The secondary of the transformer is connected to a rectifier unit of six diodes 132, and thence to a filter comprising a series 22-henry inductor and a 0.02 microfarad shunt capacitor.

For test purposes, the switch 142 in series with the load resistor 140 was closed. Open loop gain-phase measurements were made by injecting a 2-volt rms disturbing signal into the 1 k resistor 160 at the gate blocking diode 162 of the domino amplifier input. The drop across the 100-ohm resistor 114 at the output of the OpAmp is used for the X and Y inputs of the Venable Model 250 Frequency Response Analyzer. Further measurements were made on the wide band HP Model 4194A analyzer to insure that the phase margin beyond 100 KHz was compensated.

Figure 3:
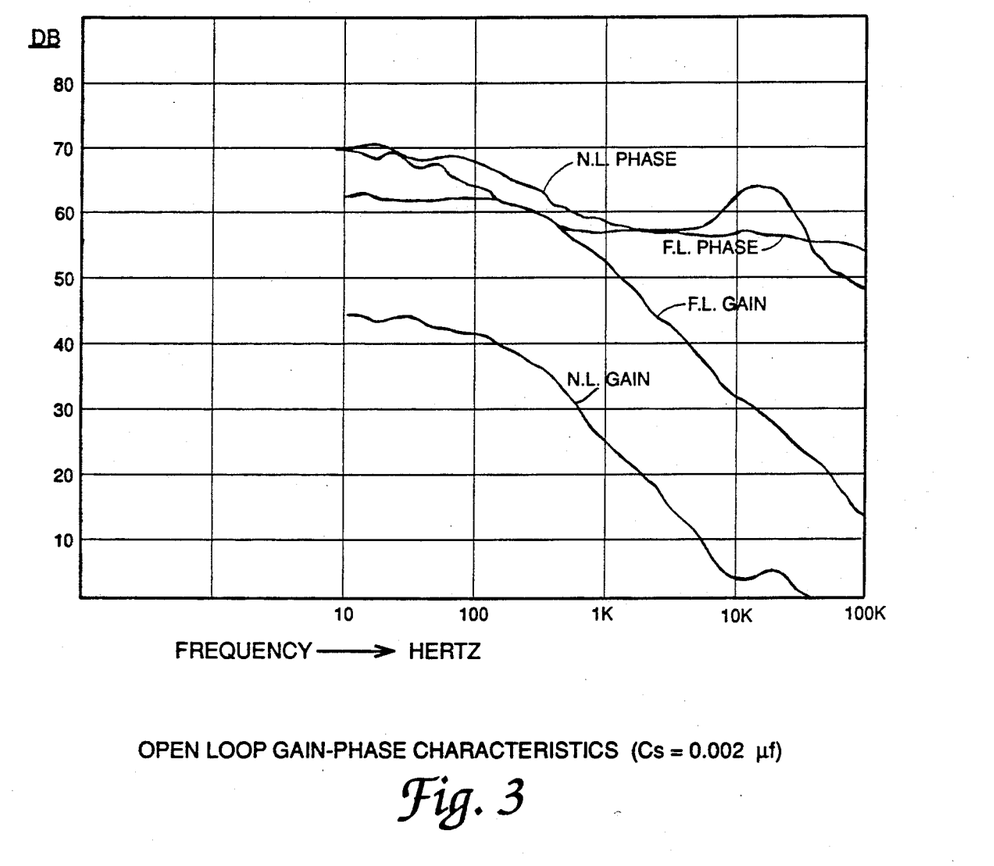
FIG. 3 is a graph showing the open loop gain-phase characteristics, with a storage capacitor Cs of 0.002 microfarads.
Figure 4:
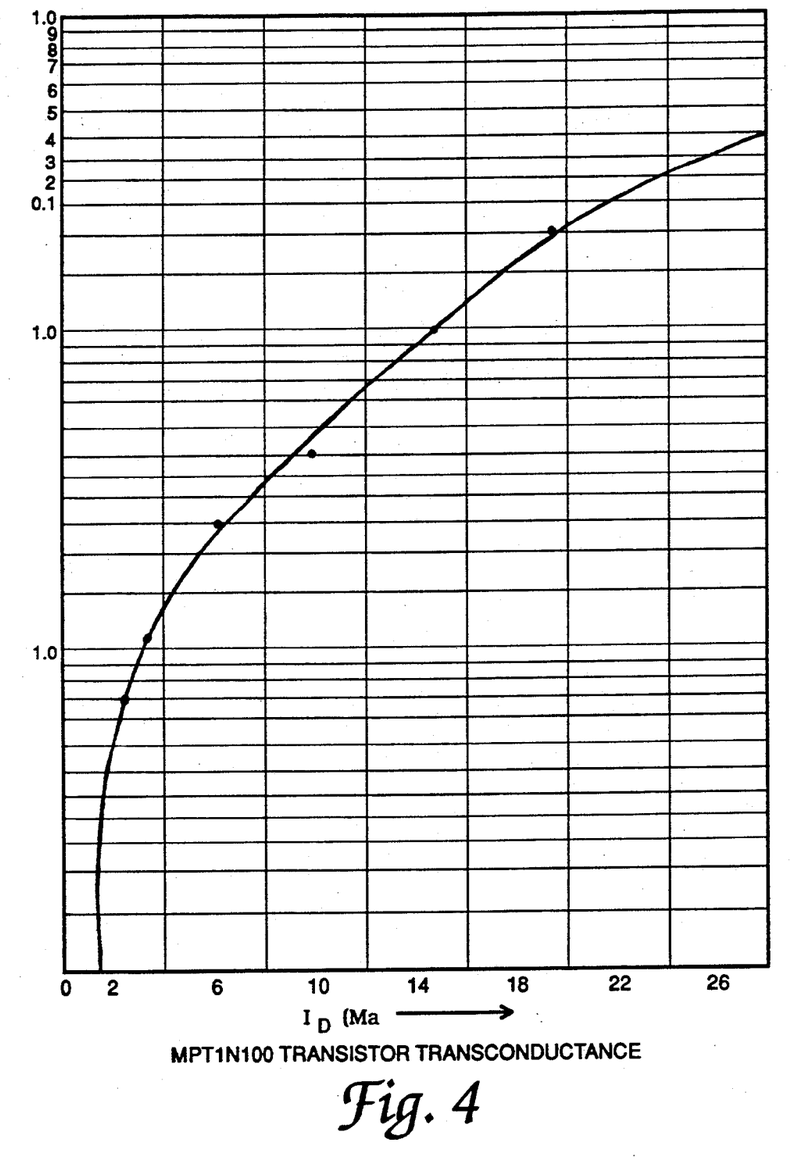
FIG. 4 is a graph showing the transconductance of a type MPT1N100 transistor.

FIG. 3 shows the measured open loop gain-phase characteristics of the regulated supply depicted in FIG. 2. Both full load (40 ma) and no-load (4 ma) plots at a regulated voltage of minus 15.75 kilo volts are shown. These plots were taken with a 0.0002 μf capacitor value for Cs rather than the 0.1 μf capacitor shown in FIG. 2. Likewise, the plots were recorded for a steady state rather than a pulsed load. The gain available for droop compensation at one Khz is 53 db rather than the minimum 46 db specified in the requirements, an excess of 7 db. The unity gain cross-over is in the order of Mhz. The crossover frequency at no-load is about 10 Khz, due to the 20 db gain reduction. This gain reduction is accounted for by the reduced transconductance of FET's used in the domino effect amplifier at low drain currents. FIG. 4 shows transconductance vs. drain current for the MTP1N100 transistor used in the development model.

Figure 5:
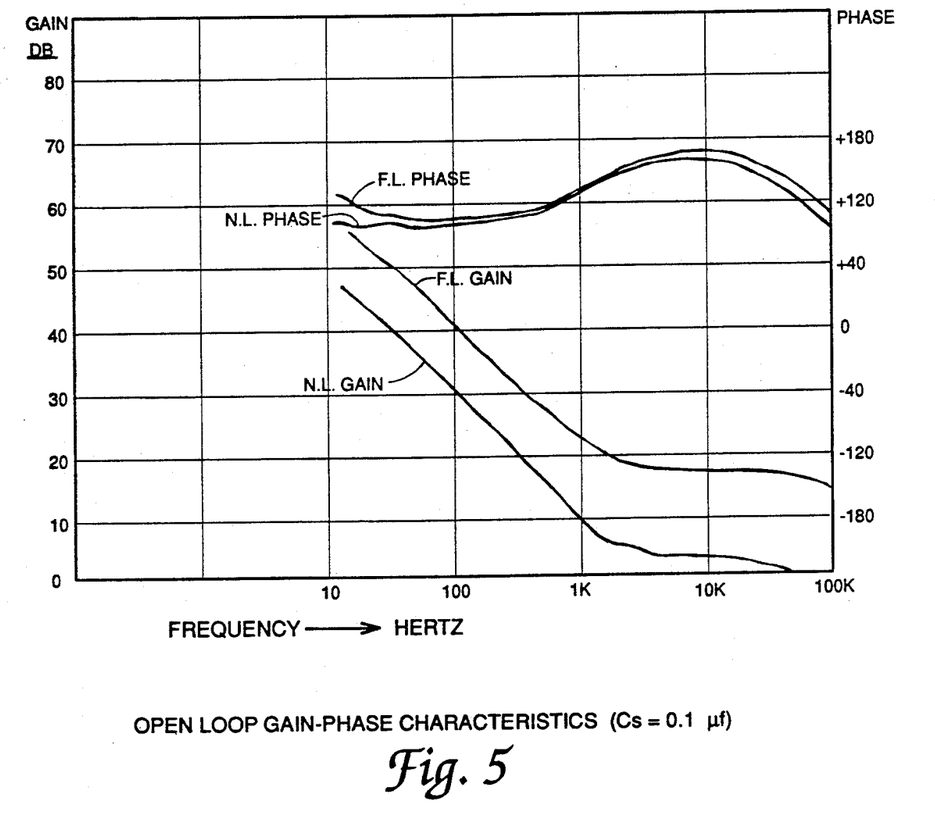
FIG. 5 is a graph showing the open loop gain-phase characteristics, with a storage capacitor Cs of 0.1 microfarads.

FIG. 5 shows the open loop gain-phase characteristics of the regulator when 0.1 μf capacitor (Cs) is placed across the output. See FIG. 2. Both the no load and full load gains fall off at a minus one slope until circuit parasitics of the 0.1 μf introduce a lead that extends the crossover frequency. Without this effect, the cross over frequency would be 4 and 10 Khz for the N.L. and F.L. crossovers, respectively. A quality capacitor and/or anti-resonant networks will correct this condition. For either the 4 or 10 Khz crossovers, the loop has a phase margin of at least 90 degrees.

Figure 6:
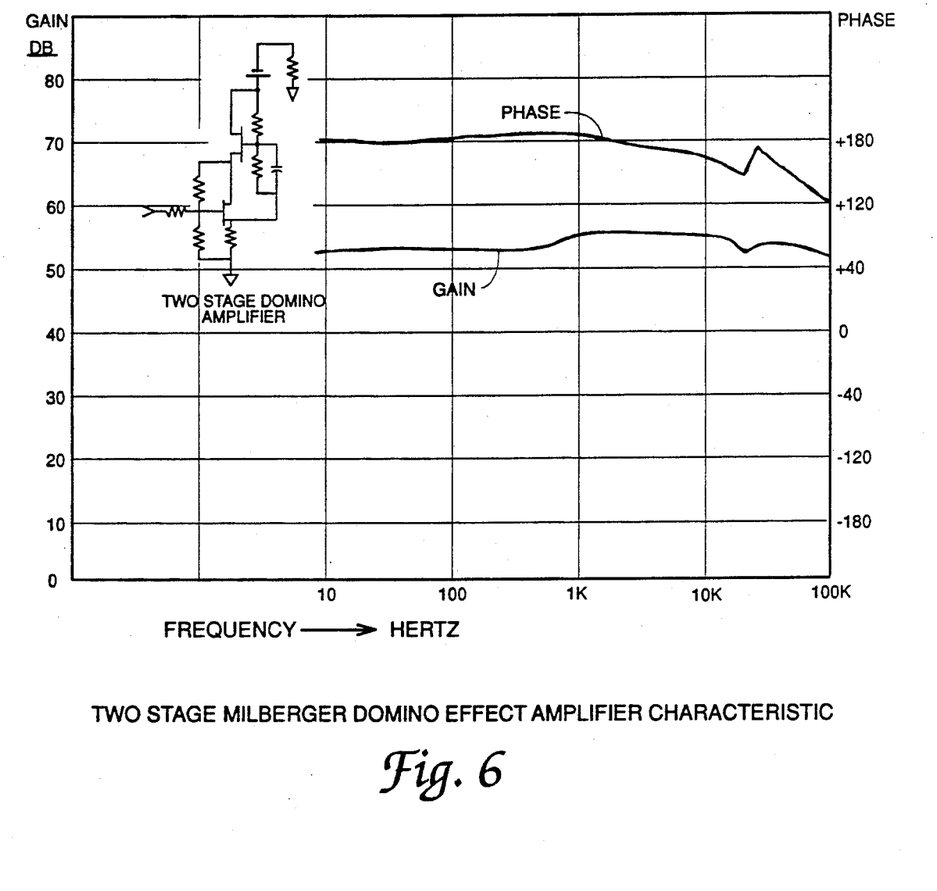
FIG. 6 is a graph showing two stage Milberger Domino Effect Amplifier characteristics.
Figure 7:
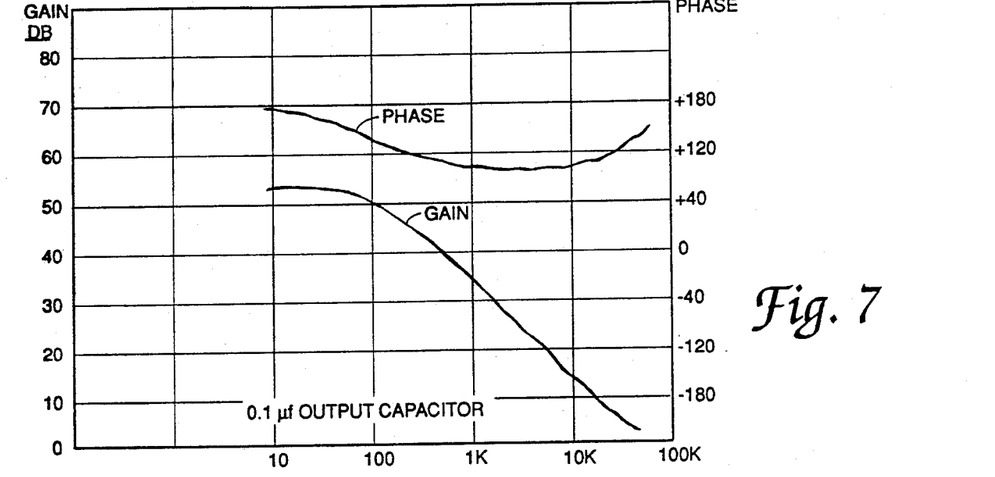
FIG. 7 is a graph showing characteristics with a 0.1 microfarad output capacitor.
Figure 8:
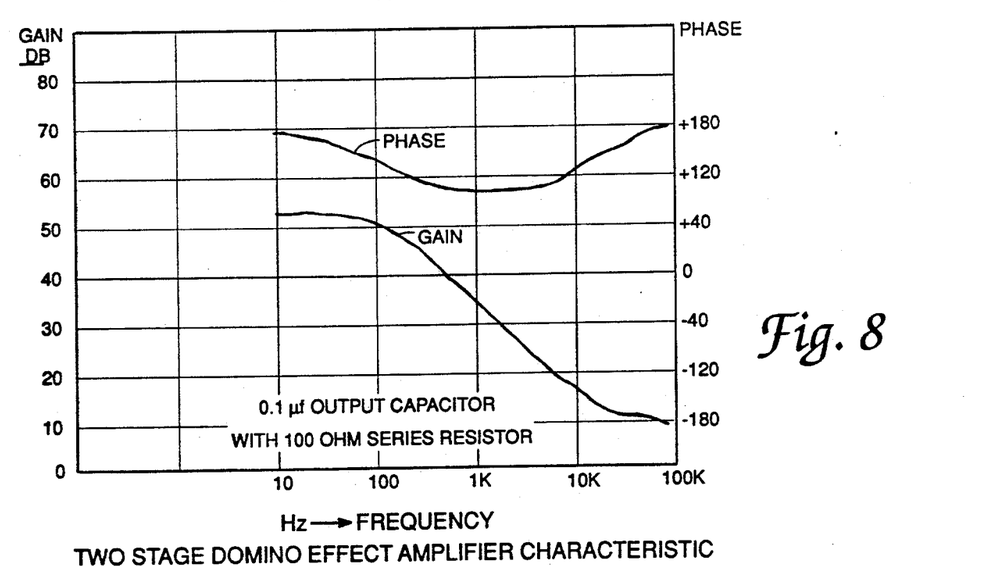
FIG. 8 is a graph showing characteristics with a 0.1 microfarad output capacitor with a 100-ohm series resistor.

FIGS. 6, 7 and 8 are provided to illustrate the effects a poor quality capacitor has on performance. FIG. 6 shows the characteristics of a two stage open loop domino effect amplifier. As shown, the bandwidth is in the order of 200 Khz. Thus, the amplifier looks like a resistor out to 100 Khz. When the load resistor R1 is shunted with the 0.1 μf capacitor used in the model, the gain falls off 20 db per decade with a crossover frequency of 60 Khz. Even in this case a phase lead is introduced due to capacitor resonant effects. To further exaggerate the effect the phase lead has, a 100 ohm resistor (FIG. 8) was placed in series with the 0.1 μf capacitor to provide a 6 Khz lead corner. As shown, the crossover frequency extends far beyond 100 khz.

Detailed Circuit Operation

FIG. 2 shows the schematic diagram of the regulator shown in the block diagram (FIG. 1). The schematic shows a dummy load rather than the microwave tube depicted in FIG. 1.

Raw High Voltage Supply Ripple Attenuation

The raw 3 phase power supply is of conventional design. The only point of interest about the supply is the capacitance between the primary and secondary windings. This capacitance provides a single wave rectifier circuit to ground. In the case of the 400 Hz supply shown, the single wave ripple content has an amplitude of about 30% of the d-c output. Since this 1200 Hertz ripple content is referenced to ground, the full amplitude appears across the load. For a load of 0.1 μf (Cs) the 1200 ripple content will be reduced by transformer primary to secondary capacitance (150 pf) divided by the load capacitance (0.1 μf) or 1,500. For the 20 kv supply, the ripple would be 20,000×30%/1,5000, or 4 volts. Since the gain of the domino regulator is 20 db at 1200 Hz (see FIG. 5), the amplitude is reduced to 400 milli-volts. If this amplitude content is not adequate, it is necessary to use special transformer winding techniques to cancel out the effect of primary to secondary capacitance coupling. In the practical case, another 30 to 40 dB of suppression can be obtained.

The five percent 2400 Hertz ripple amplitude is attenuated 40 db by the L-C filter plus 46 db by the regulator (see FIG. 2) plus 26 db for 5% ratio; thus, the 2400 Hz ripple content is down 112 db, or 40 mv.

Compensated R-C High Voltage Divider

Figure 9:
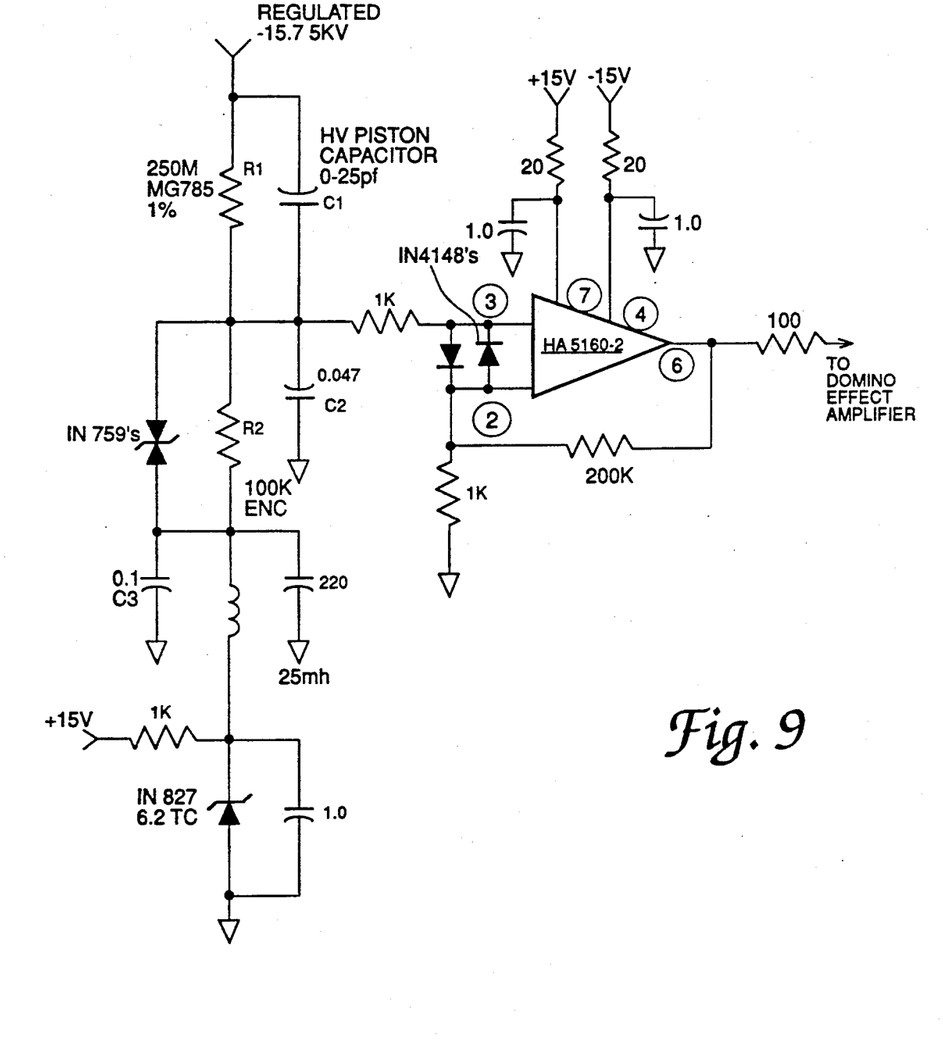
FIG. 9 is a divider and operational amplifier schematic diagram.

The 2500:1 R-C voltage divider and its isolation operational amplifier shown in FIG. 2 are detailed in FIG. 9. The compensated voltage divider is impervious to e.m.i fields and/or its location is respect to ground.

Electrical Characteristics

Figure 10:
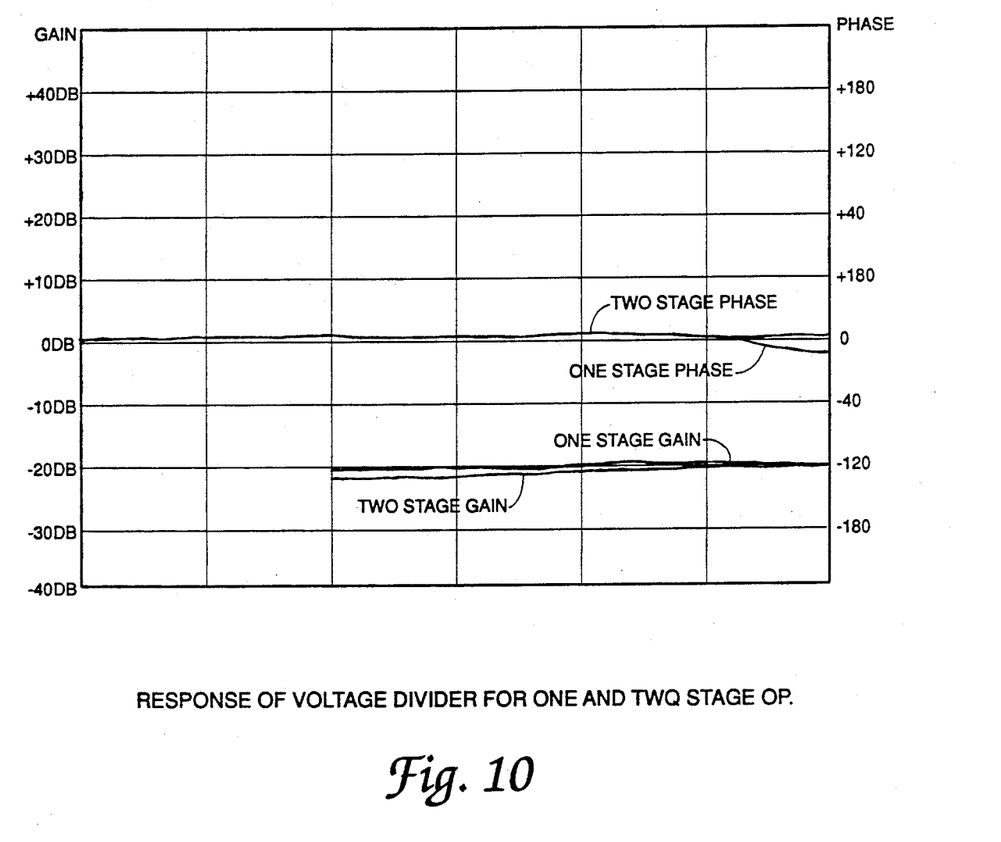
FIG. 10 is a graph showing the response of a voltage divider for one and two stage operational amplifiers.

Electrically the divider is of conventional design; wherein the r-c product of the high voltage leg is made equal to the low voltage leg. Zeners are placed across the bottom leg for protection against high voltage discharges. The back to back diodes across the input of the operational amplifier serve a similar function. Although an external reference of finer quality may be used, the development model used the 1N827 T.C. shown in FIG. 9. At 40 db of gain the Harris HA 5160-2 OpAmp is essentially flat out to 1 Mhz. Because of shielding requirements, the voltage divider and amplifier are considered to be a single unit. The gain-phase characteristics shown in FIG. 10 are the combined response of the voltage divider and amplifier. At 46 db the gain starts to fall off a bit before 1 MHz. For this reason, plots were made using a single 46 db gain stage and two cascade gain stages of equal gain. The regulator development model used a single amplifier, since the power train domino effect amplifier response sets the loop response.

Mechanical Packaging

Previous Methods

Many high voltage dividers of superb electrical characteristics have been designed. When applied to production systems, however, they often became faulty and not reproducible. Most of these shortcomings results from environmental changes and mechanical mounting. Environmental changes involve dust, temperature, E.M.I. radiation, etc. Mechanical tolerances for many dividers become critical because the distributed capacitance to ground affects the calibration. The placement of each part must be exactly the same as previous units in order to have repeatability. The placement of other components in the immediate vicinity likewise affects the calibration and also become critical. Even the routing and length of wiring to the divider was critical.

New Method

Figure 11:
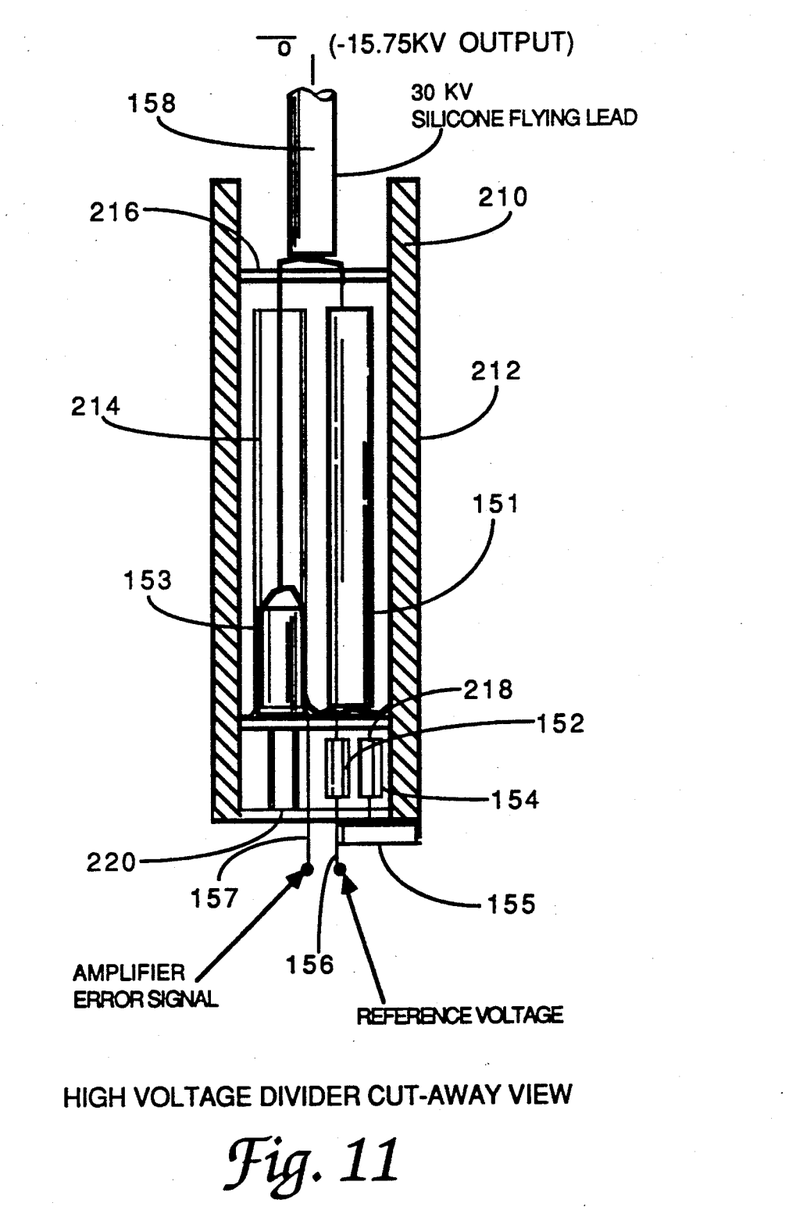
FIG. 11 is a diagram with a cut-away view of a high voltage divider.

The high voltage divider developed for the Domino Effect Regulator uses several new principals. First, the divider is wholly contained inside a grounded, shielded enclosure. The outer shield, which is grounded makes the device impervious to mechanical location or the proximity of other components. Layouts can be completely reworked without affecting the calibration of the divider. FIG. 11 shows a cut-away view of the high voltage divider. The one inch epoxy tube 210 (with a 0.125 inch wall) used for the enclosure was selected on the basis of availability. Other suitable insulating materials can be used as long as adequate voltage breakdown is provided at the high voltage end. The outer surface was coated with copper to provide a copper shield 212 and electrical ground.

In a like-wise manner, the piston capacitor 153 (a high-voltage 0-25 picofarad capacitor C1), which is enclosed inside the shielded tube 210, is constructed by using a quartz glass tube 214 (a 0.125-inch quartz glass tube having a 25 mil wall), wherein, one plate of the capacitor is a cylindrical copper slug contained within the inner surface of the glass tube and the second plate is copper foil wrapper around the outer surface of the glass tube. The thickness of the quartz glass wall sets the distance between the two plates. Since high voltage stress and corona are important considerations, a quartz glass tube was used for the piston capacitor. Quartz glass has a dielectric strength of 20,000 volts per mil, so a tube that is thick enough to be mechanically sound is virtually impervious to the effects of high voltage and corona. It must be designed to be long enough to provide adequate creepage distance to span between the low voltage and high voltage connections.

The portion of the quartz tube near the low voltage end of the 250-Meg resistor 151 was wrapped with copper foil and attached to the low voltage end of the resistor. An appropriate extension of the bottom end of the quartz tube is made to allow for creepage between the inner portion slug and the bottom supporting disk. The piston slug is the other electrode of the capacitor while the quartz glass acts as the dielectric material. The piston slug was made with rounded ends to minimize corona. A small inner conductor was used to minimize capacitance in the rest of the tube and attaches the piston slug to the high voltage end of the 250 meg resistor 151. The capacitance value is adjusted by positioning the piston slug either more or less inside of the outer shield such that the overlap increases or decreases the surface area of the two concentrical capacitor plates that are separated by the quartz glass dielectric.

All divider components are affixed to supporting disk separators 216 and 218. The 250 Meg resistor 151 is positioned near the center to minimize its stray capacitance to ground. The quartz glass piston capacitor 153 parallels the 250 Meg resistor. The low voltage R-C components fit between two supporting disks 218 and 220 at the bottom of the epoxy tube 210. These components include the lower divider resistor 152, the capacitor 154, and the capacitor 155. The amplifier error signal lead 157 for the op amp 110 is connected to the junction of the divider resistors 151 and 152. The reference voltage input lead 156 is connected to the junction of resistor 152 and capacitor 155.

The entire assembly slips into the inner walls of the epoxy tube. The top disk is inserted far enough to provide the required creepage distance for the operational voltage. Silicone insulated wire 158 (a 30 kilovolt silicone flying lead) is used to exit the high voltage of the top disk 216.

In the developmental regulator, the entire divider assembly was soldered to a OpAmp shielded box. In a production system the operational amplifier and all of its associated components would be included in the divider tube. The breadboard regulator used FC-77 as a cooling and insulation media in which the voltage divider was immersed. The divider could be operated in SF-6 equally as well. For operating in air, the divider would be potted to maintain the same dimensions. The divider has excellent electrical characteristics and good mechanical integrity. It is highly reproducible and a low cost item. It solves the high voltage electrical problem while providing a high performance divider that is virtually impervious to external influences.

Milberger Domino Effect Amplifier

The most important ingredient in the High Voltage Domino Effect Regulator is the Milberger Domino Effect amplifier which makes the regulator possible.

The domino effect amplifier is unique among cascode amplifiers because of the "Milberger Connection". The inner stage connection is so dominant that each stage in the series string reflects the electrical characteristics of the preceding stage, thus the name domino effect was coined. Each series stage elevates the d-c levels by the voltage drop across the preceding stage. For ten stages, the d-c voltage would be ten times that of the first stage. The dynamic characteristics are also cumulative. If the first stage has a voltage swing of 500 volts, the composite output would be 5,000 volts. When all stages have unity gain, the composite bandwidth would correspond to the Ft of the transistor used divided by the square root of the number of stages used. For a MOSFET that has a gain bandwidth product of one Ghz, the composite bandwidth for a ten stage domino effect amplifier would be 100 Mhz with a gain of 10. Thus the composite gain bandwidth (1 Ghz) of the high voltage amplifier is equal to the Ft of the transistor used for each stage.

The Milberger Connection

Figure 12:
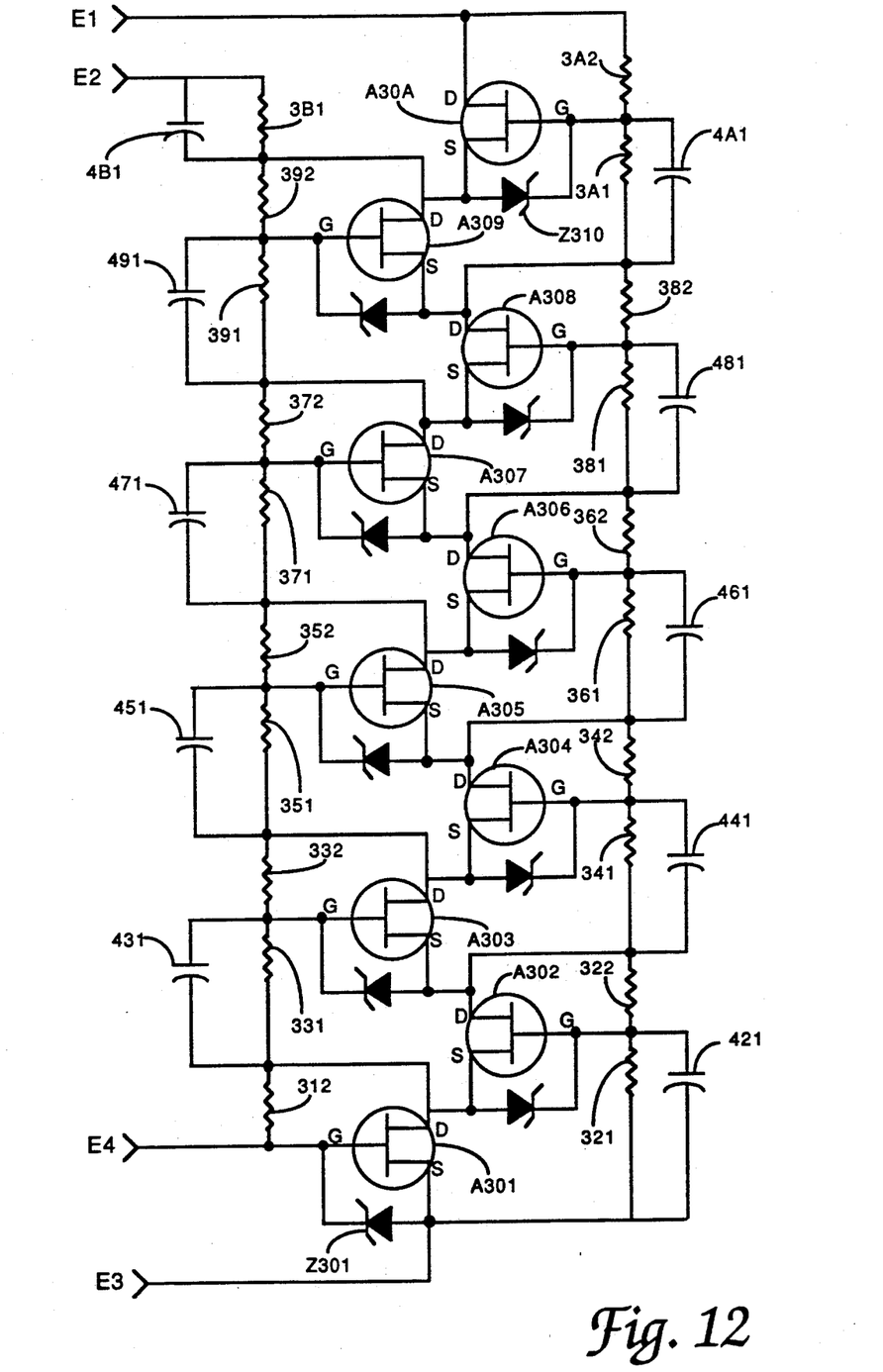
FIG. 12 is a schematic diagram of a ten-stage PHP Milberger Domino Effect Amplifier.

FIG. 12 shows the schematic diagram of the 10 stage domino effect amplifier which will be produced as a 10,000 volt, 200 watt PHP package. Two low level and two high level terminals are provided to accommodate stacked operation of the ten kv packages. Electrically the entire assembly looks like a single HV MOS FET. Where terminal E3 and E4 are the source and gate of the transistor, a terminal E1 is the drain of the transistor. Terminal E2 is provided to extend the milberger connection to the next higher level PHP package.

OPERATION: In FIG. 12 each stage is configured as a unity gain inverting amplifier. The ten transistors A301 to A30A are type MTP1N100. Referring to stage A30A, resistors 3A2 and 3B1 are made equal. Capacitor 4A1 across the resistor 3A1 neutralizes the effects of the reverse transfer capacitance of the transistor A30A and provides overdrive to compensate for the transistor gate input capacitance. The milberger connection is made by returning the reference of resistor 3A1 to the source of the proceeding stage A309 rather than to a fixed bias point. Thus the voltage appearing across transistor A30A will be equal to that of transistor A309, since transistor A309 appears as the gate reference voltage of the unity gain subsequent stages are returned to the source of their respective proceeding stage all the way down to the ground reference of the first stage A309. When the bottom stage of the domino effect amplifier has a gain greater than unity, the composite bandwidth the amplifier will be the same as the first stage, since all higher level stages appear as domino followers. The zeners (type 1N759 or equivalent) across the gate to source of the transistors serve to protect the gate from avalanche. Each stage has the gate of the transistor connected to the junction of a reference resistor and a feedback resistor of equal resistance, which may be 840 kilohms, with 800 kilohms to one megohm acceptable. A capacitor in parallel with each reference resistor may have a value of 10 picofarads. The schematic of the P-channel domino effect amplifier is the same as that of the N-channel except the gate zener is reversed in direction. A more detailed discussion of the Milberger Domino Effect amplifier is available in the copending patent application, "Domino Effect Amplifier" Ser. No. 7/318,211. A capacitor is added across the reference resistor of each stage to optimize the amplifier for linear operation.

AMPLIFIER PROTECTION

Since the regulated power supply shown in FIG. 2 supplies the body of a microwave tube, the amplifier must be protected against tube cathode or grid to body arcs. Such arcs cause the supply output to become grounded. This places the full raw supply voltage (20 Kv) across the amplifier.

The normal means of protection is to crow bar the entire supply. This protects both the tube and amplifier against power follow through after the spark gap fires. Another method is to turn off the supply. This is much slower than the crow bar method. In either case, the tube must absorb the full arc energy and the amplifier must sustain the full 20 Kv until the protection circuit becomes active. This delay time is from microseconds to milliseconds depending upon which method is used. During this period both the tube and the amplifier are placed in jeopardy. Another method of protecting the amplifier is to extend the domino amplifier chain stand off voltage in excess to that of the raw power supply. Then it is only necessary to turn off the bottom domino effect transistor stage when arcs are detected. A threshold detector, driver, and an FET gate switch is necessary to implement this protection scheme.

In the past one of the above methods would be required to protect the narrow band transmitter linear regulators used. By using the domino effect regulator, this is no longer the case. The Milberger Domino Effect amplifier has a slewing rate in the order of 20,000 volts per microsecond. The high voltage divider OpAmp response exceeds that of the amplifier. Placing current limiting resistor RL (FIG. 2) in the power train will automatically protect the amplifier when tube arcs occur. At the instant the arc starts (assuming that no pulse energy storage capacitor Cs is used), the full raw power supply voltage will appear across the domino effect amplifier. This will cause the drain-to-gate zeners of the bottom amplifier stage to go into first avalanche (nanosecond speed), thereby causing that stage to operate as a shunt regulator at 750 volts. Since the bottom stage is the bias reference for the entire amplifier, this voltage level will propagate at a rate commensurate to the bandwidth of the succeeding unity gain follower stages times the square root of the number of stages. This time is in the order of 20 to 100 nanoseconds. The domino addition of the higher level stages thus set the shunt regulator at the bottom of limiting resistor RL at 9,000 volts. This clamp mode is maintained until such time that the bottom domino responds (20,000 volts per microsecond), at which time the bottom domino reference stage is switched fully on. This action causes the bottom of resistor RL to transcend from the 9 Kv level to ground. This transition occurs well within the one microsecond slewing period. This conduction state is maintained until the arc is quenched or the supply short circuit is removed.

The value of current limiting resistor RL must be set in accordance to the time it takes for the short circuit condition to be removed. For a steady state short the resistor would be 20 k to restrict the current to the one ampere rating of the MTNP1N100 transistor used. Since the full pulse current must flow through the resistor (pulse operation with capacitor Cs), a voltage drop of 600 volts would be experienced. The regulator loop must correct for this drop. Since the peak current rating of the transistor is 6 amperes, the resistor can be reduced to 4 k which reduces the voltage drop for the 30 ma pulse load to 120 volts. Following the discharge of the power supply filter and pulse storage capacitor, the short circuit current will be reduced to the power supply limitation or until the supply is turned off. As an alternative, the limiting resistor can be placed in series with the microwave tube cathode. This arrangement protects both the transmit tube and the amplifier when tube arcs occur. Furthermore, the drop across the resistor is no longer in the regulator loop. The disadvantage of this arrangement is that no protection is provided for the amplifier when arcs external to the tube occur. The protection circuit selected will be contingent on each particular transmitter design.

Amplitude and Phase Compensation Loops

The extraordinary bandwidth and performance of the domino effect regulator, makes it a convenient tool to provide both amplitude and phase compensation. Such auxiliary regulator loops reduce complexity, cost and increases reliability over methods now used in transmitter designs.

Figure 13:
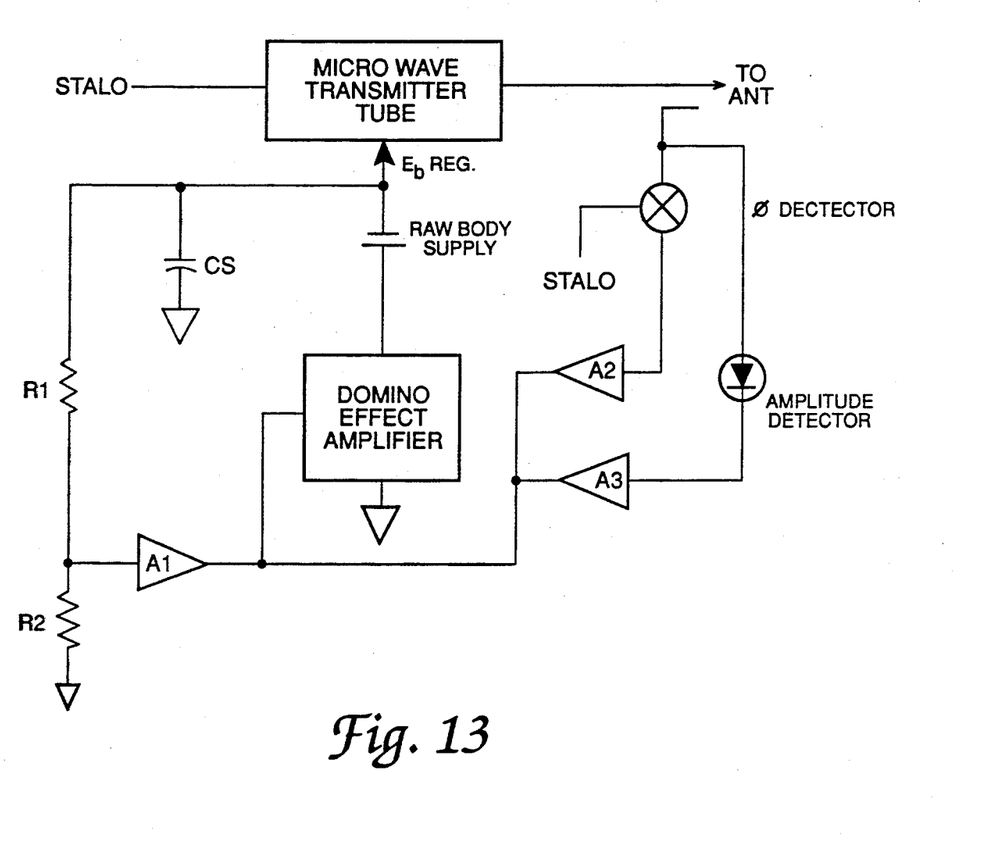
FIG. 13 is a block and schematic diagram showing amplitude and phase compensation loops.

FIG. 13 shows the essence of this new concept. The domino effect body regulator, which used OpAmp A1 in its feed back loop, is the same as that discussed earlier. As shown in the block diagram, either a phase and/or amplitude compensation loop may be incorporated in the body regulator. A phase detector and amplifier A2 would comprise the phase compensation loop. A detector and amplifier A3 would comprise the amplitude compensation loop. Considering the high performance of the body regulator, it is doubtful that the amplitude compensation loop would be required for most systems. To implement the phase compensation loop, a wide band FET is placed in parallel with bottom stage of the domino effect amplifier. This or some other summation injection method can increase the bandwidth of the phase compensation loop by an order of magnitude over that of the body regulator loop. The bandwidth margin so established, prevents inter action between the body regulator and the phase compensation loops. Further development effort is required to provide a final design.

Similar to the AmpComp and PhaseComp loops, the domino effect amplifier can be used for transmitter output r-f wave shaping. This function can be implemented by superimposing the modulation signal on the voltage reference of the body regulator.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A wide band high voltage regulator used with a high voltage power supply feeding a load, the high voltage power supply having first and second terminals for supplying direct current, with the load coupled between the first terminal and ground;
   wherein said wide band high voltage regulator comprises a domino effect amplifier, a voltage divider, and an operational amplifier;
   wherein said domino effect amplifier comprises N stages in tandem from a first stage to an Nth stage, each stage being a three-terminal unit having an input terminal, an output terminal and a common terminal, input means coupled between the input and common terminals of the first stage, the input means being coupled to an external signal source to provide an input signal to the first stage, the output terminal of the Nth stage being coupled via current-limiting means to the second terminal of said high-voltage power supply; each stage after the first having its input terminal coupled to the common terminal of the preceding stage, and its common terminal coupled to the output terminal of the preceding stage; each stage comprising an amplifying device having an inverting input, a non-inverting input and an output, a reference resistor connected between the input terminal of each stage and the non-inverting input of each amplifying device, a feedback resistor connected between the inverting input and the output of the amplifying device, the non-inverting input of each amplifying device being the common terminal of the stage, and the output of each amplifying device being the output terminal of each stage;
   wherein said voltage divider is connected from the first terminal of the high voltage power supply to ground and has a tap near the ground end;
   said operational amplifier has a non-inverting input, an inverting input, and an output, with its non-inverting input coupled to the tap of the voltage divider, its inverting input coupled to ground, and its output coupled to said input means of the domino effect amplifier.

2. A wide band high voltage regulator according to claim 1, wherein said load is a microwave transmitting tube, and a storage capacitor is connected between the first terminal of the high voltage power supply and ground;
   and wherein said voltage divider comprises a high voltage resistor in parallel with a high voltage capacitor connected between the first terminal of the high voltage power supply and said tap, and a low voltage resistor in parallel with a low voltage capacitor connected between the tap and ground, the resistance-capacitance product of the high level arm being set equal to that of the low level arm.

3. A wide band high voltage regulator according to claim 1, wherein said voltage divider comprises a high voltage resistor in parallel with a high voltage capacitor connected between the first terminal of the high voltage power supply and said tap, and a low voltage resistor in parallel with a low voltage capacitor connected between the tap and ground, so that the resistors are frequency compensated by the parallel capacitors, wherein the high voltage capacitor is a variable high voltage piston capacitor used to set the resistance-capacitance product of the high level arm equal to that of the low level arm.

4. A wide band high voltage regulator according to claim 1, wherein in said domino effect amplifier there are at least a second stage and a third stage following said first stage, and at least for the third to the Nth stages, the reference and feedback resistors are of equal value to provide a gain of substantially one, with the gain of the amplifier being the sum of the gains of the stages;
   wherein the amplifying device of each stage is a FET transistor, having a gate electrode used as the inverting input, a source electrode used as the non-inverting input, and a drain electrode used as the output.

5. A wide band high voltage regulator according to claim 4, wherein said load is a microwave transmitting tube, and a storage capacitor is connected between the first terminal of the high voltage power supply and ground;

and wherein said voltage divider comprises a high voltage resistor in parallel with a high voltage capacitor connected between the first terminal of the high voltage power supply and said tap, and a low voltage resistor in parallel with a low voltage capacitor connected between the tap and ground, the resistance-capacitance product of the high level arm being set equal to that of the low level arm.

6. A wide band high voltage regulator according to claim 4, wherein said voltage divider is connected from the first terminal of the high voltage power supply to ground and has a tap near the ground end;

wherein said voltage divider comprises a high level arm in series with a low level arm, wherein the high level arm comprises a high-voltage resistor in parallel with a high-voltage capacitor coupled between the first terminal and the tap, and the low level arm comprises a low-voltage resistor in parallel with a low-voltage capacitor coupled between the tap and ground, so that the resistors are frequency compensated by the parallel capacitors; the high-voltage resistor having a high voltage end for connection via the first terminal to the high voltage power supply and a low voltage end connected to said tap, wherein the high voltage capacitor is a variable high voltage piston capacitor used to set the resistance-capacitance product of the high level arm equal to that of the low level arm.

7. A wide band high voltage regulator according to claim 6, wherein said load is a microwave transmitting tube, and a storage capacitor is connected between the first terminal of the high voltage power supply and ground;

wherein said voltage divider is wholly contained inside an enclosure comprising an insulating tube coated with metal to provide a metal shield and electrical ground;

wherein the high-voltage capacitor comprises a quartz glass tube, a first plate which is a cylindrical copper slug contained within the inner surface of the quartz glass tube and a second plate which is a copper foil wrapper around the outer surface of the quartz glass tube, with the thickness of the quartz glass tube setting the distance between the two plates, the quartz glass tube being designed to be long enough to provide adequate creepage distance to span between low voltage and high voltage connections; the quartz glass tube having a portion near the low voltage end of said high-voltage resistor which is wrapped with said copper foil and attached to the low voltage end of the high-voltage resistor;

wherein the high-voltage resistor and the high-voltage capacitor are supported within said enclosure between a first supporting disk at the high-voltage end and a second supporting disk at the low-voltage end, and the low-voltage resistor and the low-voltage capacitor are supported within said enclosure between the second supporting disk and a third supporting disk at an end of the enclosure;

wherein said quartz glass tube has an extension at the low voltage end made to allow for creepage between the inner portion slug and the second supporting disk, the metal slug has rounded ends to minimize corona, a small inner conductor is used to minimize capacitance in the rest of the quartz glass tube and attaches the metal slug to the high-voltage end of the high-voltage resistor, the capacitance value being adjusted by positioning the copper slug either more or less inside of the outer shield such that the overlap increases or decreases the surface area of the two concentric capacitor plates that are separated dielectric formed by the quartz glass tube;

wherein the high-voltage resistor is positioned near the center of the enclosure to minimize its stray capacitance to ground, and the piston capacitor parallels the high-voltage resistor;

wherein the first supporting disk is inserted far enough into the enclosure to provide a required creepage distance for the operational voltage, and wherein the first terminal is formed with silicone insulated wire to exit at the first supporting disk.

8. A wide band high voltage regulator according to claim 5, wherein said microwave transmitting tube generates r-f output which is coupled to an antenna;

further including an amplitude compensation regulator loop comprising an amplitude detector and an amplifier in tandem coupled from the output to said antenna to the input means of the domino effect amplifier.

9. A wide band high voltage regulator according to claim 5, wherein said microwave transmitting tube generates r-f output which is coupled to an antenna;

further including a phase compensation regulator loop comprising an amplitude detector and an amplifier in tandem coupled from the output to said antenna to the input means of the domino effect amplifier.

10. A wide band high voltage regulator according to claim 9, further including an amplitude compensation regulator loop comprising an amplitude detector and an amplifier in tandem coupled from the output to said antenna to the input means of the domino effect amplifier.

* * * * *